United States Patent
Tomioka et al.

(10) Patent No.: US 10,906,246 B2
(45) Date of Patent: Feb. 2, 2021

(54) OPTICAL SHAPING APPARATUS, MANUFACTURING METHOD, AND STORAGE MEDIUM

(71) Applicant: CANON KABUSHIKI KAISHA, Tokyo (JP)

(72) Inventors: Yuichi Tomioka, Utsunomiya (JP); Hideo Genda, Tokyo (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 20 days.

(21) Appl. No.: 16/354,657

(22) Filed: Mar. 15, 2019

(65) Prior Publication Data
US 2019/0210285 A1 Jul. 11, 2019

Related U.S. Application Data

(63) Continuation of application No. PCT/JP2017/034190, filed on Sep. 22, 2017.

(30) Foreign Application Priority Data

Sep. 29, 2016 (JP) .................................. 2016-191422

(51) Int. Cl.
*B29C 64/264* (2017.01)
*B29C 64/386* (2017.01)
(Continued)

(52) U.S. Cl.
CPC ............ *B29C 64/264* (2017.08); *B29C 41/00* (2013.01); *B29C 64/129* (2017.08);
(Continued)

(58) Field of Classification Search
CPC ..... B29C 64/264; B29C 41/00; B29C 64/129; B29C 64/393; B29C 64/386; B29C 67/00;
(Continued)

(56) References Cited

U.S. PATENT DOCUMENTS 4,945,032 A * 7/1990 Murphy ................ G03F 7/0037
264/401
5,175,077 A 12/1992 Grossa
(Continued)

FOREIGN PATENT DOCUMENTS

CN 103737929 A 4/2014
JP H101228828 A 9/1989
(Continued)

OTHER PUBLICATIONS

International Search Report issued in Intl. Appln. No. PCT/JP2017/034190 dated Dec. 19, 2017. English ranslation provided.
(Continued)

*Primary Examiner* — Ramesh B Patel
(74) *Attorney, Agent, or Firm* — Rossi, Kimms & McDowell LLP (57) ABSTRACT

An optical shaping apparatus includes a light modulation element having a plurality of pixels and configured to modulate light from a light source for each pixel, a controller configured to control the light modulation element based on each of a plurality of two-dimensional shape data obtained from three-dimensional shape data, and a moving member configured to move a cured portion cured by the modulation light among the photocurable resin in a direction separating from the light-transmissive portion. The controller controls the light modulation element so as to irradiate the modulation light of an irradiation light amount corresponding to a light amount necessary for curing for each resin area, onto each of a plurality of resin areas in the photocurable resin based on a temperature distribution or a temperature change in the photocurable resin.

10 Claims, 10 Drawing Sheets

(51) Int. Cl.
*G03F 7/00* (2006.01)
*B33Y 10/00* (2015.01)
*B33Y 30/00* (2015.01)
*B29C 64/129* (2017.01)
*B33Y 50/02* (2015.01)
*B29C 64/393* (2017.01)
*B33Y 40/20* (2020.01)
*B29C 41/00* (2006.01)
*B33Y 40/00* (2020.01)
*B29C 67/00* (2017.01)

(52) U.S. Cl.
CPC .......... *B29C 64/386* (2017.08); *B29C 64/393* (2017.08); *B33Y 10/00* (2014.12); *B33Y 30/00* (2014.12); *B33Y 40/20* (2020.01); *B33Y 50/02* (2014.12); *G03F 7/0037* (2013.01); *B29C 67/00* (2013.01); *B33Y 40/00* (2014.12)

(58) Field of Classification Search
CPC ......... B33Y 40/20; B33Y 10/00; B33Y 30/00; B33Y 50/02; B33Y 40/00; G03F 7/0037
See application file for complete search history.

(56) References Cited

U.S. PATENT DOCUMENTS

| | | | |
|---|---|---|---|
| 5,902,537 A | 5/1999 | Almquist | |
| 7,014,988 B2* | 3/2006 | DeVoe | G02B 6/1221 430/321 |
| 7,670,541 B2* | 3/2010 | Kuzusako | B33Y 50/00 264/401 |
| 8,142,179 B2 | 3/2012 | Kihara | |
| 9,529,371 B2 | 12/2016 | Nakamura | |
| 9,931,828 B2 | 4/2018 | Kobayashi | |
| 10,618,270 B2* | 4/2020 | Knecht | B33Y 10/00 |
| 2003/0033128 A1* | 2/2003 | Nagano | B29C 64/129 703/12 |
| 2006/0078831 A1 | 4/2006 | DeVoe | |
| 2009/0140172 A1* | 6/2009 | Kihara | B29C 64/135 250/492.1 |
| 2009/0140466 A1* | 6/2009 | Kuzusako | B33Y 50/00 264/406 |
| 2010/0027956 A1 | 2/2010 | DeVoe | |
| 2013/0221551 A1* | 8/2013 | Genda | B29D 11/00403 264/1.36 |
| 2014/0107823 A1* | 4/2014 | Huang | B29C 64/112 700/98 |
| 2015/0088292 A1* | 3/2015 | Inoue | B22F 3/008 700/98 |
| 2015/0277146 A1* | 10/2015 | Crespo Vazquez | B29D 11/00951 264/1.36 |
| 2016/0167160 A1 | 6/2016 | Hellestam | |
| 2017/0182708 A1* | 6/2017 | Lin | B29O 64/393 |
| 2018/0065302 A1* | 3/2018 | Arai | B29C 64/129 |
| 2018/0264735 A1* | 9/2018 | Vilajosana | B22F 3/1055 |
| 2019/0210292 A1* | 7/2019 | Tomioka | B29C 64/129 |
| 2019/0212572 A1* | 7/2019 | Tomioka | H04N 13/167 |
| 2019/0217540 A1* | 7/2019 | Tomioka | B29C 67/00 |
| 2019/0371642 A1* | 12/2019 | Iwai | H01L 21/681 |

FOREIGN PATENT DOCUMENTS

| | | |
|---|---|---|
| JP | H10231727 U | 2/1990 |
| JP | H104099618 A | 3/1992 |
| JP | H104232728 A | 8/1992 |
| JP | H04301431 A | 10/1992 |
| JP | H106270266 A | 9/1994 |
| JP | H08142203 A | 6/1996 |
| JP | H109076353 A | 3/1997 |
| JP | H09277384 A | 10/1997 |
| JP | H110180881 A | 7/1998 |
| JP | H10513130 A | 12/1998 |
| JP | 3173212 B2 | 6/2001 |
| JP | 2002331591 A | 11/2002 |
| JP | 2003507223 A | 2/2003 |
| JP | 2003345030 A | 12/2003 |
| JP | 2005131938 A | 5/2005 |
| JP | 3782049 B2 | 6/2006 |
| JP | 2007111989 A | 5/2007 |
| JP | 2009113294 A | 5/2009 |
| JP | 2009132126 A | 6/2009 |
| JP | 2009132127 A | 6/2009 |
| JP | 2009137048 A | 6/2009 |
| JP | 4499538 B2 | 7/2010 |
| JP | 5023975 B2 | 9/2012 |
| JP | 5082537 B2 | 11/2012 |
| JP | 2015016610 A | 1/2015 |
| JP | 2015030199 A | 2/2015 |
| JP | 2015058678 A | 3/2015 |
| JP | 2016087866 A | 5/2016 |
| JP | 2018503536 A | 2/2018 |
| MX | 2014012717 A | 4/2016 |
| WO | 9623647 A2 | 8/1996 |
| WO | 0114125 A1 | 3/2001 |

OTHER PUBLICATIONS

Opinion issued in Intl. Appln. No. PCT/JP2017/034190 dated Dec. 19, 2017.
International Search Report issued in Intl. Appln No. PCT/JP2017/034180 dated Oct. 24, 2017 English translation provided.
Written Opinion issued in Intl. Appln. No. PCT/JP2017/034180 dated Oct. 24, 2017. English translation provided.
International Preliminary Report on Patentability issued in Intl. Appln. No. PCT/JP2017/034180 dated Apr. 11, 2019. English translation provided.
International Search Report issued in Intl. Appln. No. PCT/JP2017/034183 dated Oct. 31, 2017. English translation provided.
Written Opinion issued in Intl. Appln. No. PCT/JP2017/034183 dated Oct. 31, 2017. English translation provided.
International Preliminary Report on Patentability issued in Intl. Appln. No. PCT/JP2017/034183 dated Apr. 11, 2019. English translation provided.
International Search Report issued in Intl. Appln. No. PCT/JP2017/034198 dated Nov. 28, 2017. English translation provided.
Written Opinion issued in Intl. Appln. No. PCT/JP2017/034198 dated Nov. 28, 2017. English translation provided.
International Preliminary Report on Patentability issued in Intl. Appln. No. PCT/JP2017/034198 dated Apr. 11, 2019. English translation provided.
Office Action issued in U.S. Appl. No. 16/299,324 dated May 28, 2020.
English translation of Written Opinion issued in Intl. Appln. No. PCT/JP2017/034190 dated Dec. 19, 2017, previously cited in IDS filed Mar. 15, 2019.
International Preliminary Report on Patentability issued in Intl. Appln. No. PCT/JP2017/034190 dated Apr. 11, 2019. English translation provided.
Office Action issued in Japanese Application No. 2016-191240 dated Jul. 21, 2020. English translation provided.
Office Action issued in Japanese Application No. 2016-191241 dated Jul. 21, 2020. English translation provided.
Office Action issued in Japanese Appln. No. 2016-191582 dated Sep. 1, 2020. English machine translation provided.
Office Action issued in U.S. Appl. No. 16/299,533 dated Jun. 19, 2020.
Office Action issued in Chinese Appln. No. 201780059330.X dated Sep. 22, 2020. English translation provided.
Office Action issued in U.S. Appl. No. 16/299,324 dated Nov. 17, 2020.

* cited by examiner

OPTICAL SHAPING APPARATUS, MANUFACTURING METHOD, AND STORAGE MEDIUM

CROSS-REFERENCE TO RELATED APPLICATIONS

This application is a Continuation of International Patent Application No. PCT/JP2017/034190, filed on Sep. 22, 2017, which claims the benefit of Japanese Patent Application No. 2016-191422, filed on Sep. 29, 2016, both of which are hereby incorporated by reference herein in their entirety.

BACKGROUND OF THE INVENTION

Field of the Invention

The present invention relates to a technology for curing a photocurable resin and for shaping a three-dimensional object.

Description of the Related Art

The three-dimensional shaping generates two-dimensional shape data (image data) for each position in a height direction from three-dimensional shape data representing a shape of a three-dimensional object, sequentially forms and laminates a shaped layer having a shape corresponding to each of sectional shape data, and obtains a three-dimensional object (a shaped object). As one three-dimensional shaping method of this type, Japanese Patent Laid-Open No. ("JP") 2015-016610 discloses a method using a photocurable resin.

More specifically, a bottom surface of a container storing a liquid photocurable resin is formed of a light transmitting plate, and the photocurable resin is cured by the light irradiated from a bottom side of the light transmitting plate through the light transmitting plate. At this time, a single shaped layer is wholly and simultaneously cured by collectively projecting (irradiating) light modulated according to the sectional shape data through a light modulation element having a plurality of two-dimensionally arrayed pixels. Then, a three-dimensional object can be shaped by repeating the step of upwardly moving the cured shaped layer to form the next shaped layer.

This method can make the time required for shaping shorter than that of a method for sequentially curing the photocurable resin by scanning each laser beam (spot) for each shaped layer.

However, the three-dimensional shaping method disclosed in JP 2015-016610 causes a temperature distribution and a temperature change in the photocurable resin due to the environmental temperature fluctuations, the heat generated by the photocuring of the photocurable resin, and the like. Since a light amount required for curing, which is an irradiation light amount required per unit volume for the photocurable resin to cure, depends on the temperature, the light amount required for curing distributes and changes in the photocurable resin during shaping. As a result, even when the light having a uniform light amount is irradiated onto the photocurable resin, insufficiently or unnecessarily curing areas are generated, so that the good shaping accuracy cannot be obtained.

SUMMARY OF THE INVENTION

The present invention provides an optical shaping apparatus and the like which can provide the good shaping accuracy even when a curing reaction rate distributes or changes in a photocurable resin during shaping.

An optical shaping apparatus according to one aspect of the present invention includes a container having a light-transmissive portion and configured to store a liquid photocurable resin, a light modulation element having a plurality of pixels and configured to modulate light from a light source for each pixel, an optical system configured to irradiate modulation light from the light modulation element onto the photocurable resin through the light-transmissive portion, a controller configured to control the light modulation element based on each of a plurality of two-dimensional shape data obtained from three-dimensional shape data, and a moving member configured to move a cured portion cured by the modulation light among the photocurable resin in a direction separating from the light-transmissive portion. The controller controls the light modulation element so as to irradiate the modulation light of an irradiation light amount corresponding to a light amount necessary for curing for each resin area, onto each of a plurality of resin areas in the photocurable resin based on a temperature distribution or a temperature change in the photocurable resin.

A three-dimensional object manufacturing method according to another aspect of the present invention is configured to manufacture a three-dimensional object. The three-dimensional object manufacturing method includes the steps of storing a liquid photocurable resin in a container having a light-transmissive portion, irradiating modulation light from a light modulation element onto the photocurable resin through the light-transmissive portion by controlling the light modulation element based on each of two-dimensional shape data obtained from three-dimensional shape data, the light modulation element having a plurality of pixels and being configured to modulate light from a light source for each pixel, moving a cured portion cured by the modulation light among the photocurable resin in a direction separating from the light-transmissive portion, and controlling the light modulation element so as to irradiate the modulation light of an irradiation light amount corresponding to a light amount necessary for curing for each resin area, onto each of a plurality of resin areas in the photocurable resin based on a temperature distribution or a temperature change in the photocurable resin.

A non-transitory computer-readable storage medium according to another aspect of the present invention stores an optically shaping program that enables a computer in an optical shaping apparatus to execute an optically shaping process. The optical shaping apparatus includes a container having a light-transmissive portion and configured to store a liquid photocurable resin, a light modulation element having a plurality of pixels and configured to modulate light from a light source for each pixel, and an optical system configured to irradiate modulation light from the light modulation element onto the photocurable resin through the light-transmissive portion. The optically shaping process includes the steps of controlling the light modulation element based on each of a plurality of two-dimensional shape data obtained from three-dimensional shape data, moving a cured portion cured by the modulation light among the photocurable resin in a direction separating from the light-transmissive portion, and controlling the light modulation element so as to irradiate the modulation light of an irradiation light amount corresponding to a light amount necessary for curing for each resin area, onto each of a plurality of resin areas in the photocurable resin based on a temperature distribution or a temperature change in the photocurable resin.

Further features of the present invention will become apparent from the following description of exemplary embodiments with reference to the attached drawings.

DESCRIPTION OF THE EMBODIMENTS

Referring now to the accompanying drawings, a description will be given of embodiments according to the present invention.

First Embodiment

Figure 1:
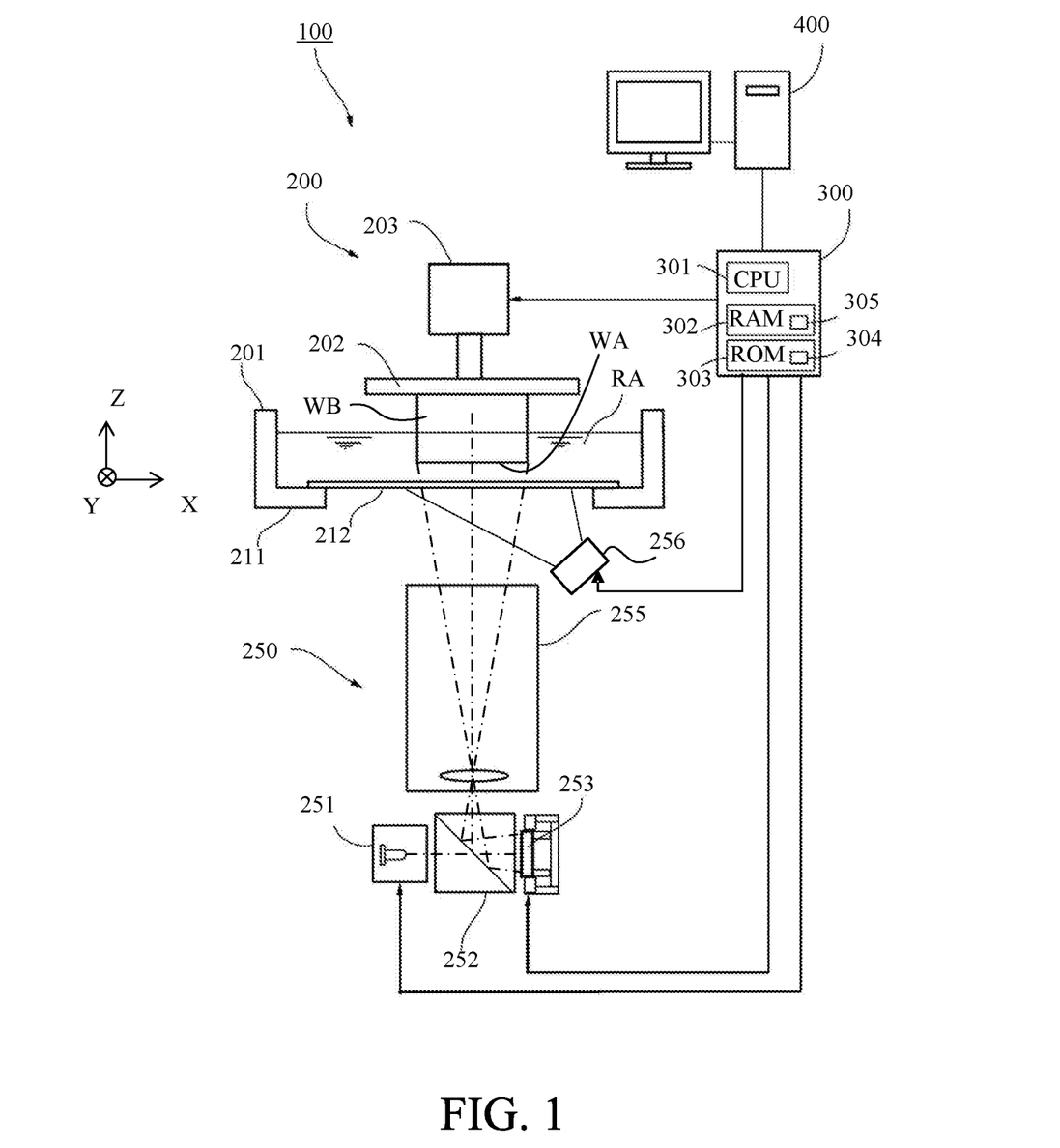
FIG. 1 illustrates a configuration of a three-dimensionally shaping apparatus according to a first embodiment of the present invention.

FIG. 1 illustrates a configuration of a three-dimensionally shaping apparatus (optical shaping apparatus) according to a first embodiment of the present invention. A three-dimensionally shaping apparatus 100 forms a three-dimensionally shaped object by sequentially laminating shaped layers formed through irradiating and curing of a liquid photocurable resin with image light described later. This embodiment will illustratively describe image light as ultraviolet light (referred to as UV light hereinafter) and the ultraviolet curable resin (referred to as UV curable resin hereinafter) used as the photocurable resin. However, the image light other than the UV light and the photocurable resin other than the UV curable resin may be used.

The three-dimensionally shaping apparatus 100 includes a shaping unit 200 and a controller 300 for controlling the shaping unit 200. An image processing apparatus 400 as an external computer is connected to the controller 300.

The shaping unit 200 includes a container 201, a holding plate 202 as a moving member, a moving mechanism 203, and a projection unit 250. The container 201 includes a tank for storing a liquid UV curable resin RA, and has an opening in an upper portion. The container 201 includes a container body 211 and a light transmitting plate (light-transmissive portion or light transmitter) 212 having a light transmission property so as to close the opening formed on the bottom surface of the container body 211. The UV curable resin RA has a curing characteristic when receiving the UV light of a predetermined light amount or more. Hence, irradiating the UV light having a predetermined light amount or more only to a region to be cured can form the shaped object WB having an intended shape.

The light transmitting plate 212 has the UV/oxygen transmitting characteristic that transmits the UV light and oxygen. A thin fluoro-resin plate such as Teflon (registered trademark) AF2400 can be used for this light transmitting plate 212. The light transmitting plate 212 transmits oxygen in air and forms an oxygen-rich atmosphere at the interface with the UV-curable resin RA, thereby preventing the UV curable resin RA from being cured by the UV light (radical polymerization reaction). In other words, the UV curable resin RA is characterized in being curable by the UV light, and prevented from being cured in the oxygen-rich environment.

Figure 2A:
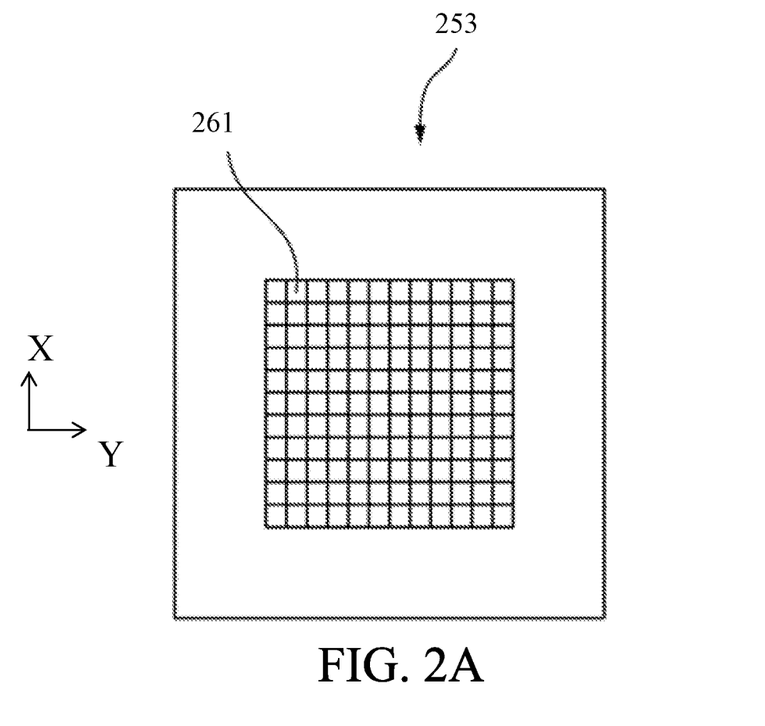
FIGS. 2A and 2B illustrate an image forming element and a shaping unit used in the three-dimensionally shaping apparatus according to the first embodiment.
Figure 2B:
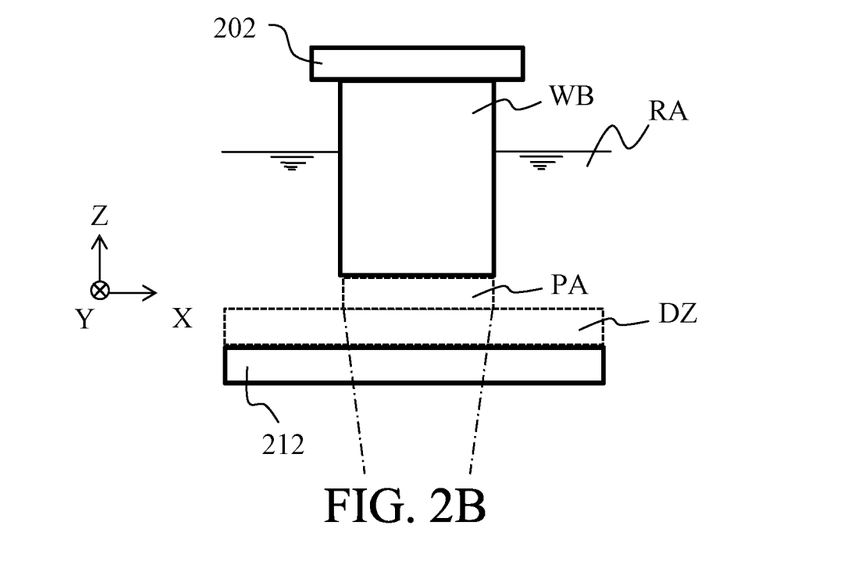

Therefore, as illustrated in FIG. 2B, a dead zone (dead band) DZ in which the UV curable resin RA is not cured even under the UV light is formed in a layer shape near the light transmitting plate 212. Then, a layered portion (referred to as a shaped resin liquid layer hereinafter) located just above the dead zone DZ of the UV curable resin RA is cured by the UV light (image light), thereby forming a shaped layer (intermediate in course of shaping) WA. Thereby, the shaped layer WA never adheres to the light transmitting plate 212.

Oxygen that permeates the light transmitting plate 212 may use oxygen in air as described above, or an unillustrated oxygen supply unit (nozzle) may be disposed near the light transmitting plate 212 to supply oxygen to the light transmitting plate 212. The shaping unit 200 or the entire three-dimensionally shaping apparatus 100 may be placed in a high-pressure oxygen atmosphere.

The moving mechanism 203 moves the holding plate 202 in the vertical direction through the upper opening in the container 201. The moving mechanism 203 includes a pulse motor, a ball screw, and the like, and moves the holding plate 202 at an arbitrary speed or an arbitrary pitch under control of the controller 300. The following description sets the moving direction (vertical direction in the drawing) of the holding plate 202 by the moving mechanism 203 in FIG. 1 to a Z direction (thickness direction) and the direction orthogonal to the Z direction (lateral direction in the drawing) to an X direction. The direction orthogonal to the Z direction and the X direction (the depth direction in the drawing) is set to a Y direction. The moving mechanism 203 moves the holding plate 202 in an (upward) direction separating from the light transmitting plate 212 and in a (downward) direction for making the holding plate 202 closer to the light transmitting plate 212 in the Z direction. During shaping, the holding plate 202 is upwardly moved from the lower end position facing the dead zone DZ. When the image forming light is irradiated onto the UV curable resin RA through the light transmitting plate 212 while the holding plate 202 is located at the lower end position, a first shaped layer is formed and adhered to the holding plate 202. The next shaped layer is laminated and formed on the first shaped layer between the first shaped layer and the dead zone DZ by irradiating the image light onto the UV curable resin RA through the light transmitting plate 212 while the first shaped layer is lifted by a predetermined amount from the lower end position. This procedure can form a shaped object WB in which a plurality of shaped layers WA sequentially formed are laminated.

The projection unit 250 is disposed on the lower side of the container 201. The projection unit 250 includes a UV light source 251, a beam splitter 252, an image forming element 253 as a light modulation element, a driving mechanism 254, and a projection optical system 255. If necessary, another optical element for changing the projection optical path may be added to the projection unit 250.

The UV light source 251, the beam splitter 252, and the light modulation element 253 are arranged in series in the X direction as the horizontal direction. A projection optical system 255 is disposed above (in the Z direction) the beam splitter 252. The projection optical system 255 is disposed so that its light emitting surface faces the light transmitting plate 212.

The UV light source 251 emits the UV light and includes an LED, a high-pressure mercury lamp, or the like. The UV light emitted from the UV light source 251 passes through the beam splitter 252 and irradiates the image forming element 253 with the UV light.

The image forming element 253 has a plurality of pixels, and modulates the irradiated UV light for each pixel to generate image light as modulation light. This embodiment uses a DMD (Digital Micro mirror Device) as the image forming element 253. As illustrated in FIG. 2, the image forming element 253 as the DMD includes a micro mirror in which each of the plurality of two-dimensionally arranged pixels 261 moves (rotates) between two angular positions (ON position and OFF position). Each pixel 261 can provide a binary control in which light and dark are expressed by the ON state where the mirror is located at the ON position and the OFF state where the mirror is located at the OFF position.

The image processing apparatus 400 generates a plurality of original image data as two-dimensional shape data on a plurality of sections in the Z direction from previously prepared three-dimensional shape data as shape data of a three-dimensional object. Each original image data is binary data including 1 indicating that it is a shaping pixel position or 0 indicating that it is a non-shaping pixel position for a plurality of two-dimensional pixel positions. The image processing apparatus 400 outputs to the controller 300 motion image data in which a plurality of original image data are arranged in chronological order.

The controller 300 corrects the brightness (the irradiation light amount from the image forming element 253) corresponding to the light amount necessary for curing to be described later for a plurality of original image data in the motion image data to obtain a plurality of corrected image data. Through a binary control over each pixel 261 in the image forming element 253 sequentially based on each of the plurality of corrected image data (two-dimensional shape data), as described above, the UV light is modulated for each pixel 261 to generate the image light. The controller 300 can perform a halftone control through a duty control that switches the ON state and OFF state of each pixel 261 at a high speed. The controller 300 also functions as a conversion unit.

This embodiment describes the DMD used as the image forming element 253, but may use a reflection type liquid crystal panel or a transmission type liquid crystal panel as the image forming element 253. That illustration can also provide a halftone representation by high-speed switching of the reflectance or transmittance as well as the light and dark representation by the binary control over the reflectance or transmittance of a pixel. In addition, any element capable of forming the image light having light and dark or halftone can be used as the image forming element 253.

As described above, the beam splitter 252 transmits the UV light from the UV light source 251, and reflects the image light from the image forming element 253 toward the projection optical system 255. The projection optical system 255 includes one or a plurality of lenses, and projects (irradiates) the image light so that the image light from the image forming element 253 (the beam splitter 252) is imaged at a position optically conjugate with the image forming element 253 in the container 201. This embodiment sets the imaging position of the image light to the shaping position. The shaping position is a position just above the dead zone DZ in the container 201, and the shaped layer WA is formed when the shaped resin liquid layer PA located at the shaping position in the UV curable resins RA receives the image light. The shaped layer WA can be formed with a good resolution by imaging or making narrowest the image light from each pixel in the image forming element 253 at the shaping position.

The controller 300 controls the UV light source 251, the moving mechanism 203, the image forming element 253, and the driving mechanism 254 to instruct moving mechanism 203 to continuously or intermittently lift the holding plate 202 at a speed in synchronization with the formation (curing) of the shaped layer WA according to the above motion image. This configuration performs three-dimensional shaping so that the shaped object WB grows while its upper end is held by the holding plate 202.

Hence, the three-dimensionally shaping apparatus 100 according to this embodiment collectively projects the image light from the projection unit 250 to the shaping position in forming each of the plurality of sequentially laminated shaped layers WA and cures the shaped resin liquid layer PA at once. Therefore, the time required for shaping the shaped object WB becomes shorter than another apparatus that forms each shaped layer by scanning a laser beam or by applying the UV curable resin and by then irradiating light onto it.

The controller 300 is configured as a computer that includes a CPU 301, a RAM 302 having a work area used for a calculation in the CPU 301, and a ROM 303. The ROM 303 is a recording medium that records a program 304, and is a rewritable nonvolatile memory, such as an EEPROM. The CPU 301 executes a three-dimensional shaping process (three-dimensional object manufacturing method) described later for controlling the shaping unit 200 by reading the three-dimensional shaping program 304 as a computer program recorded in the ROM 303.

The three-dimensional shaping program 304 may be recorded in a non-transitory computer-readable storage medium, such as a nonvolatile memory (semiconductor memory or the like), a recording disk (optical disk or magnetic disk), and an external storage unit (hard disk drive).

In shaping with the conventional three-dimensional shaping apparatus, the temperature distributes or changes in the UV curable resin due to the environmental fluctuations, the heat generated by photocuring of the UV curable resin, and the like. A light amount per unit volume necessary for the UV curable resin to cure at a predetermined curing rate (referred to as a light amount necessary for curing hereinafter) depends on the temperature. Thus, the light amount necessary for curing in the photocurable resin (the resin liquid layer) distributes or changes due to the temperature distribution and temperature change generated during shaping. As a result, even when UV light having a uniform light amount is irradiated onto the shaped resin liquid layer, insufficiently and unnecessarily cured areas are generated in the shaped layer, and a good shaping accuracy cannot be obtained.

Figure 10:
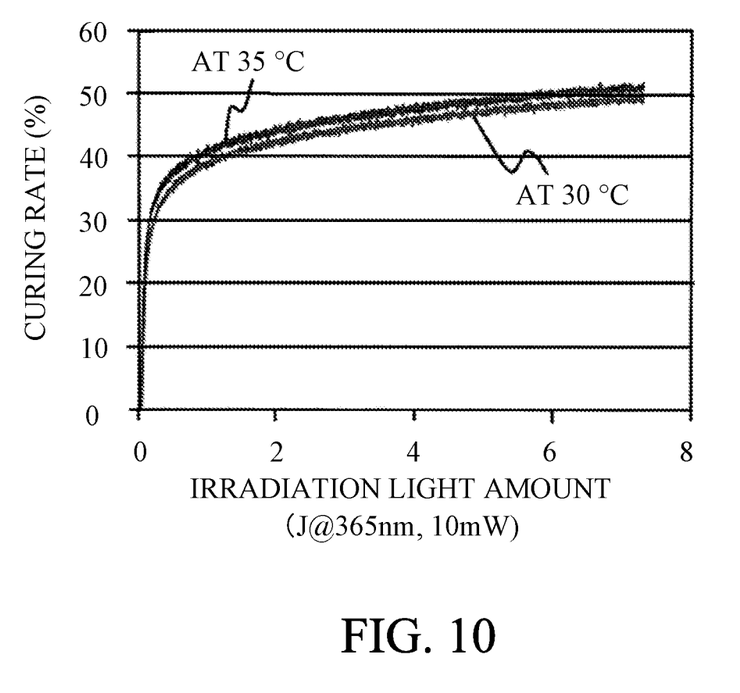
FIG. 10 illustrates a relationship between the light irradiation amount of the photocurable resin and the curing rate.

FIG. 10 illustrates a relationship between the light irradiation amount and a curing rate of acrylic resin as general photocurable resin. The curing rate (or curing reaction rate) indicates a curing rate of the entire photocurable resin that receives the light having the same energy. The general photocurable resin such as acrylic resin is characterized in that the higher the temperature is, the higher the curing rate becomes when light having the same light amount is irradiated. In other words, the higher the temperature is, the smaller the light amount necessary for curing becomes. As described above, when the photocurable resin used for the three-dimensional shaping has a temperature distribution and a uniform light irradiation amount is given to the photocurable resin, insufficient or unnecessary curing occurs depending on the area or defective shaping occurs. This embodiment controls the UV light irradiation amount per unit volume for each resin area in the UV curable resin RA (shaped resin liquid layer PA), and can suppress the defective shaping.

Figure 3:
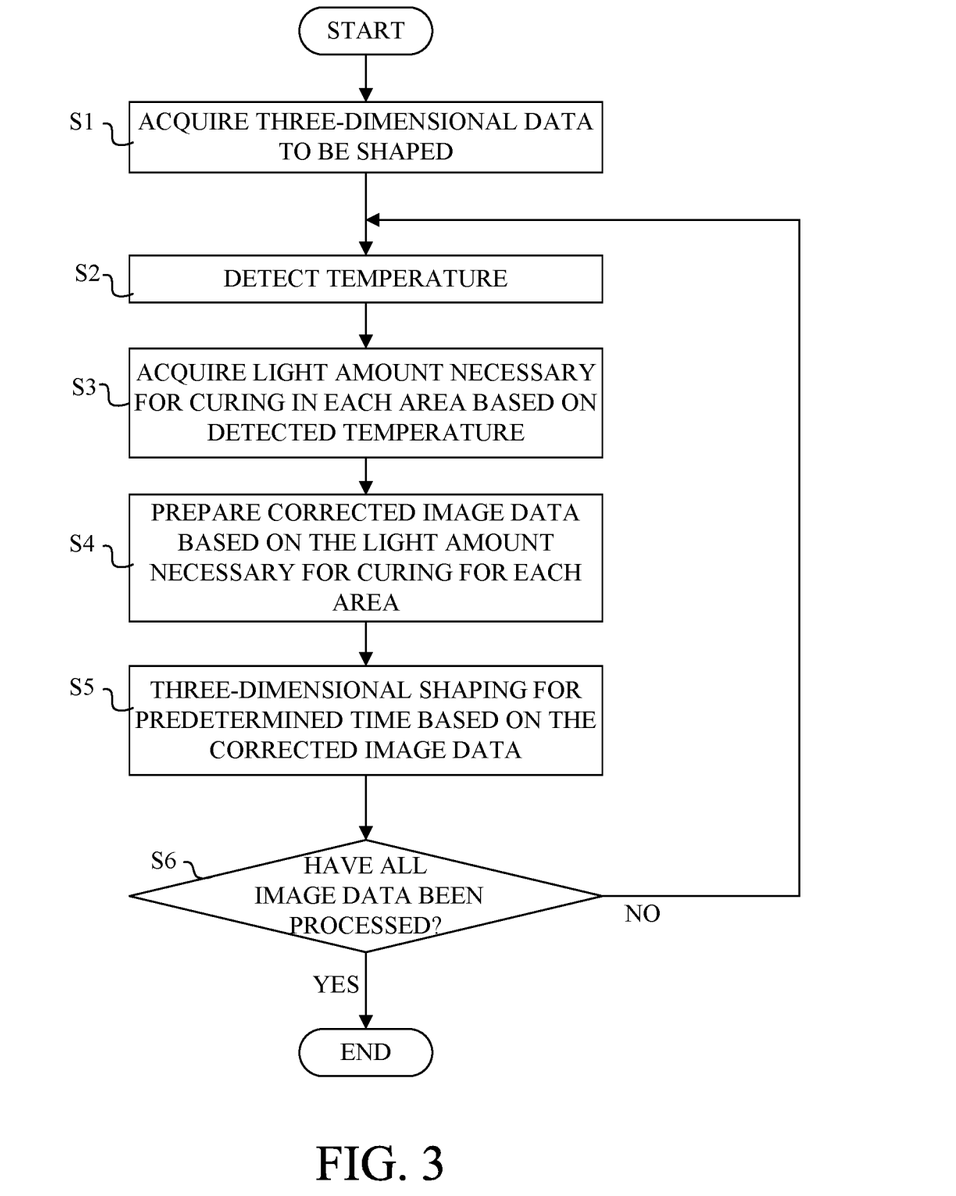
FIG. 3 is a flowchart of a three-dimensional shaping process according to the first embodiment.

This embodiment executes the three-dimensional shaping processing described below. The flowchart in FIG. 3 illustrates a flow of a three-dimensional shaping process executed by the CPU 301 in the controller 300 in accordance with the above three-dimensional shaping program according to this embodiment.

In the step S1, the CPU 301 acquires from the image processing apparatus 400 motion image data in which a plurality of original image data are chronologically arranged or three-dimensional shape data of a three-dimensional object to be shaped.

Next, in the step S2, the CPU 301 detects (measures) the temperature distribution of the light transmitting plate 212 on the real time basis by using a thermographic sensor (infrared camera) 256 as a temperature detector illustrated in FIG. 1. The light transmitting plate 212 is located near the above shaping position via the dead zone DZ. Thus, detecting the temperature distribution in the light transmitting plate 212 is equivalent with acquiring the temperature distribution of the shaped resin liquid layer PA located at the shaping position. If there is a difference between the temperature distribution in the light transmitting plate 212 and the actual temperature distribution in the shaped resin liquid layer PA, the detected temperature distribution of the light transmitting plate 212 may be corrected and used as the temperature distribution of the shaped resin liquid layer PA.

This embodiment provides a plurality of resin area by dividing the shaped resin liquid layer PA into a plurality of portions in the X direction and the Y direction, respectively, and acquires the temperature for each resin area from the detected temperature distribution. One resin area is an area that receives image light from one or more pixels in the image forming element 253. Detecting the temperature distribution at predetermined time intervals by the thermographic sensor 256 can also detect a temperature change for each resin area. A method of directly detecting the temperature distribution of the shaped resin liquid layer PA may be adopted.

Next, in the step S3, the CPU 301 acquires the light amount necessary for curing for each of the plurality of resin area for each of the plurality of original image data based on the temperature distribution and the temperature change detected in the step S2. Herein, the storage unit 305 in the RAM 302 previously stores a data table including the light amount necessary for curing corresponding to a variety of temperature distributions and temperatures, and the CPU 301 reads out of the data table the light amount necessary for curing corresponding to the detected temperature distribution and temperature. The CPU 301 may calculate the light amount necessary for curing for each resin area using an arithmetic expression.

In the next step S4, the CPU 301 generates corrected image data by making a correction based on the light amount necessary for curing acquired in the step S3 for each data area corresponding to each resin area in each original image data acquired in the step S1. The image forming element 253 maintains the pixel 261 in the ON state only for the ON time and then makes it in the OFF state so that the image light of the irradiation light amount corresponding to the ON time is irradiated onto the resin area in the UV curable resin RA. A ratio of the ON time to the OFF time used to maintain the OFF state or the ON time (ON time+OFF time) will be called an irradiation duty ratio.

When the irradiation light amount corresponding to the ON time (irradiation duty ratio) set for the data area in the original image data is smaller than the light amount necessary for curing, the CPU 301 generates corrected image data in which the ON time of the data area is increased so as to obtain the irradiation light amount equal to the light amount necessary for curing. On the other hand, when the irradiation light amount corresponding to the ON time set for the data area in the original image data is excessively larger than the light amount necessary for curing, the CPU 301 generates corrected image data in which the ON time of the data area is decreased so as to obtain the irradiation light amount equal to the light amount necessary for curing.

Next, in the step S5, the CPU 301 sequentially irradiates onto the shaped resin liquid layer PA the image light corresponding to the plurality of corrected image data. The CPU 301 controls the moving mechanism 203 so that the holding plate 202 upwardly moves in synchronization with the irradiation of the image light corresponding to the corrected image data. Thus, the shaped object WB including the plurality of shaped layers WA is thus shaped during the predetermined time period.

Next, in the step S6, the CPU 301 determines whether the irradiation of the image light has been completed for all of the corrected image data. If there is remaining image data, the flow returns to the step S2 and repeats the processing from the step S2 to the step S5 until the irradiation of image light for all image data is completed.

Herein, the temperature in the shaped resin liquid layer PA may change due to the heat generated by photocuring over time from the shaping start of the shaped object and/or the temperature change of the space where the three-dimensional shaping apparatus 100 is installed. Accordingly, this embodiment repeats the processing from the step S2 to the step S4 at the above predetermined time intervals, and then provides shaping in the step S5. In other words, the CPU 301 detects the temperature distribution in the light transmitting plate 212 (the shaped resin liquid layer PA) at predetermined time intervals during shaping, reads a new light amount necessary for curing from the data table according to the temperature change, and updates the corrected image data. This configuration can suppress the distortion of the shaped layer WA from the start to the end of shaping.

Figure 4A:
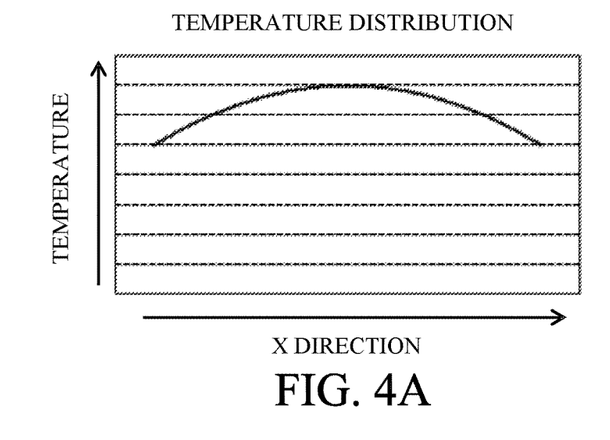
FIGS. 4A to 4D illustrate a temperature distribution, a light amount necessary for curing, an irradiation light amount, and an irradiation light amount/light amount necessary for curing in the X direction according to the first embodiment.
Figure 4B:
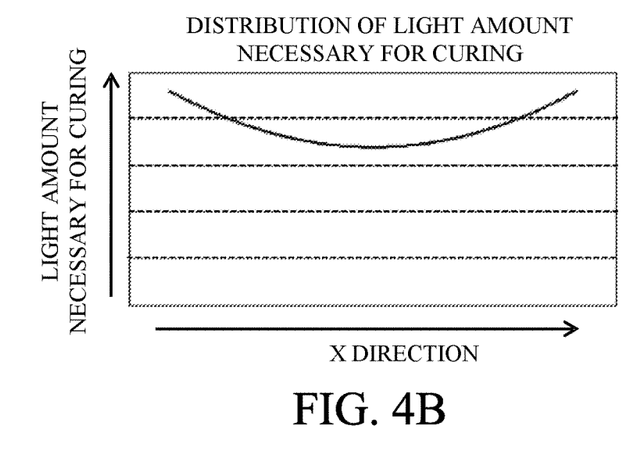

FIG. 4A shows an illustrative temperature distribution of the shaped resin liquid layer PA in the X direction in the three-dimensional shaping apparatus 100 according to this embodiment. In general shaping of the shaped object, the temperature at the central portion is higher than that at the peripheral portion. FIG. 4B shows an illustrative distribution of the light amount necessary for curing in the X direction in the shaped resin liquid layer PA when there is the temperature distribution illustrated in FIG. 4A. The light amount necessary for curing in the central resin area (first resin area) having a high temperature is smaller than the light amount necessary for curing in the peripheral part (second resin area) having a low temperature in the shaped resin liquid layer PA.

Figure 4C:
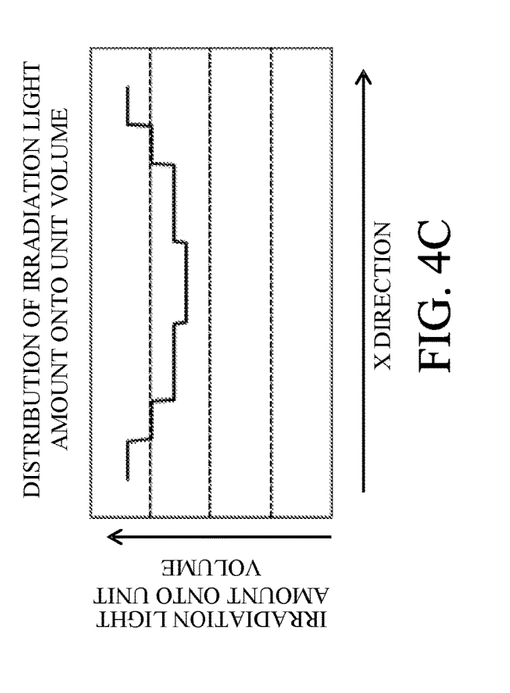

FIG. 4C shows an illustrative irradiation light amount of image light per unit volume in a plurality of resin areas in the X direction controlled by the three-dimensional shaping process according to this embodiment. The irradiation light amount is set to be small for the central resin area where the light amount necessary for curing is small, and is set large for the resin area at the peripheral part where the light amount necessary for curing is large, as illustrated in FIG. 4B.

Figure 4D:
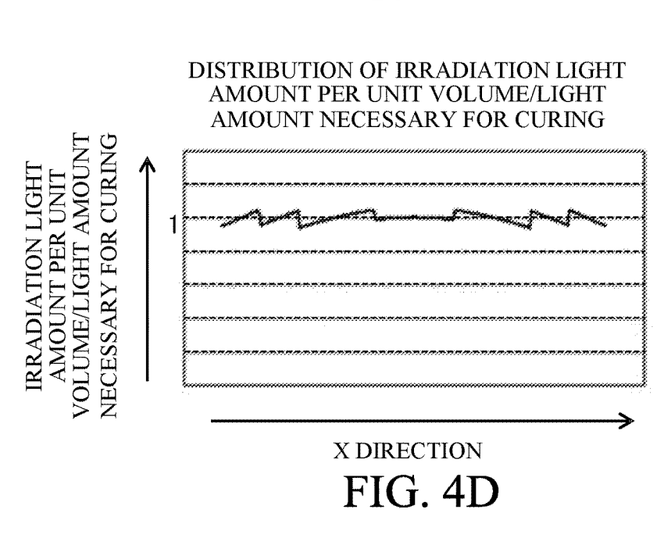

Due to this control over the irradiation light amount (control of the image forming element 253), as illustrated in FIG. 4D, the ratio of the irradiation light amount per unit volume for each resin area to the light amount necessary for curing is substantially equally maintained (as approximately 1) in the entire resin area. In other words, a substantially targeted curing rate can be obtained over the entire resin area. Thereby, the shaped object WB can be shaped with a good shaping accuracy.

Only the X direction has been described in FIGS. 4A to 4D, but this is similarly applied to the Y direction.

Figure 5A:
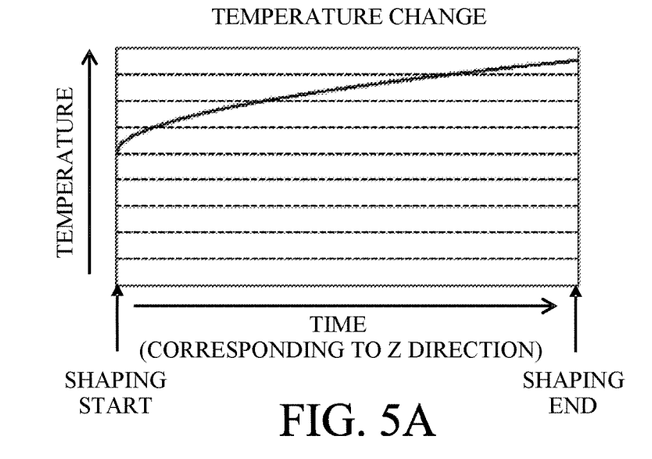
FIGS. 5A to 5D illustrate a temperature change, a light amount necessary for curing, an irradiation light amount, and an irradiation light amount/light amount necessary for curing with time according to the first embodiment.
Figure 5B:
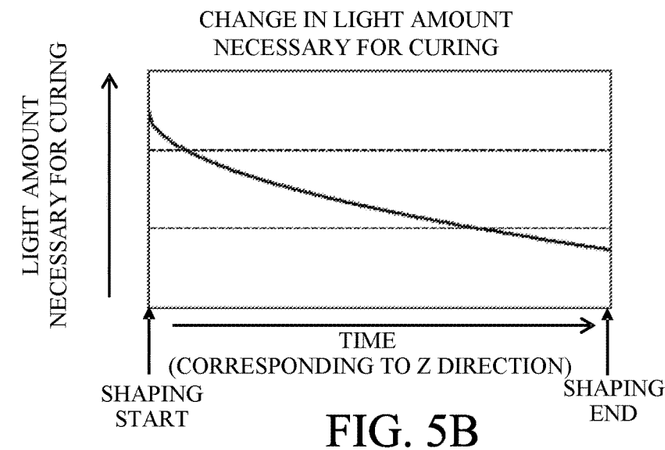

FIG. 5A shows an illustrative temperature change in a resin area (for example, the center part) in the shaped resin liquid layer PA for each time from the start to the end of shaping. The heat accumulates in the shaped resin liquid layer PA over time from the shaping start, and its temperature rises. FIG. 5B shows an illustrative change in the light amount necessary for curing for the temperature change of the resin area illustrated in FIG. 5A. The higher the temperature of the resin area is, the smaller the light amount necessary for curing becomes.

Figure 5C:
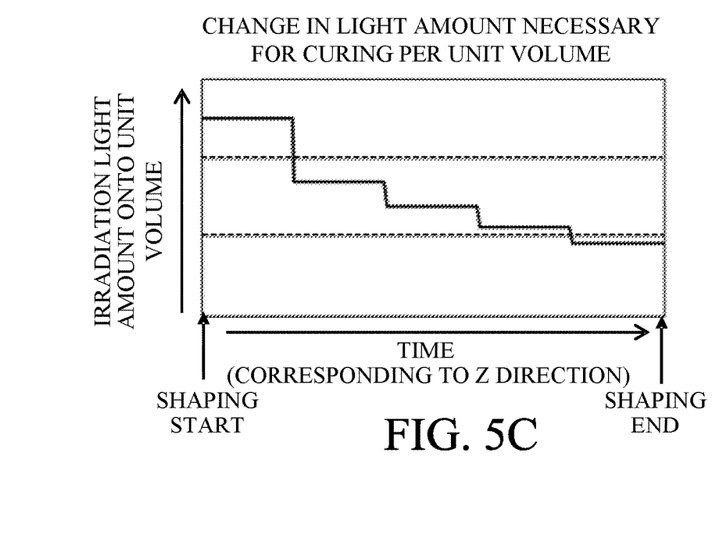

FIG. 5C shows an illustrative irradiation light amount of the image light per unit volume in the resin area controlled over time from the shaping start by the three-dimensional shaping process according to this embodiment. As the light amount necessary for curing illustrated in FIG. 5B decreases, the irradiation light amount is also controlled to decrease. Since different shaped layers WA are successively formed in the Z direction over time, the irradiation light amount to the shaped resin liquid layer PA (resin area) is controlled for each shaping of each shaped layer WA. This is similar for each resin area in the X and Y directions.

Figure 5D:
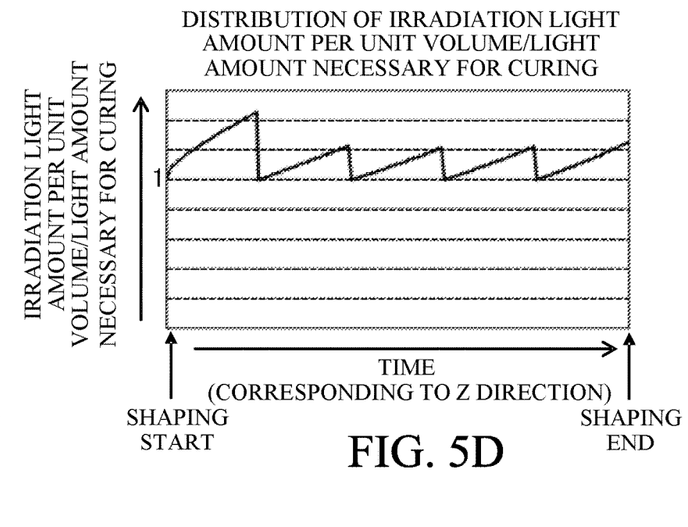

Due to the irradiation light amount control, as illustrated in FIG. 5D, a ratio of the irradiation light amount per unit volume of the resin area to the light amount necessary for curing can be prevented from significantly changing from 1 over time (or as the temperature rises). In other words, almost the target curing rate can be obtained in each resin area from the start to the end of shaping. Thereby, the shaped object WB can be shaped with a good shaping accuracy.

The data area and temporal division numbers that make the illumination light amount ratios different in FIGS. 4A to 4D and 5A to 5D are merely illustrative for description purposes, the division number set as large as possible can satisfactorily suppress the defective curing of the shaped object.

Second Embodiment

Figure 6:
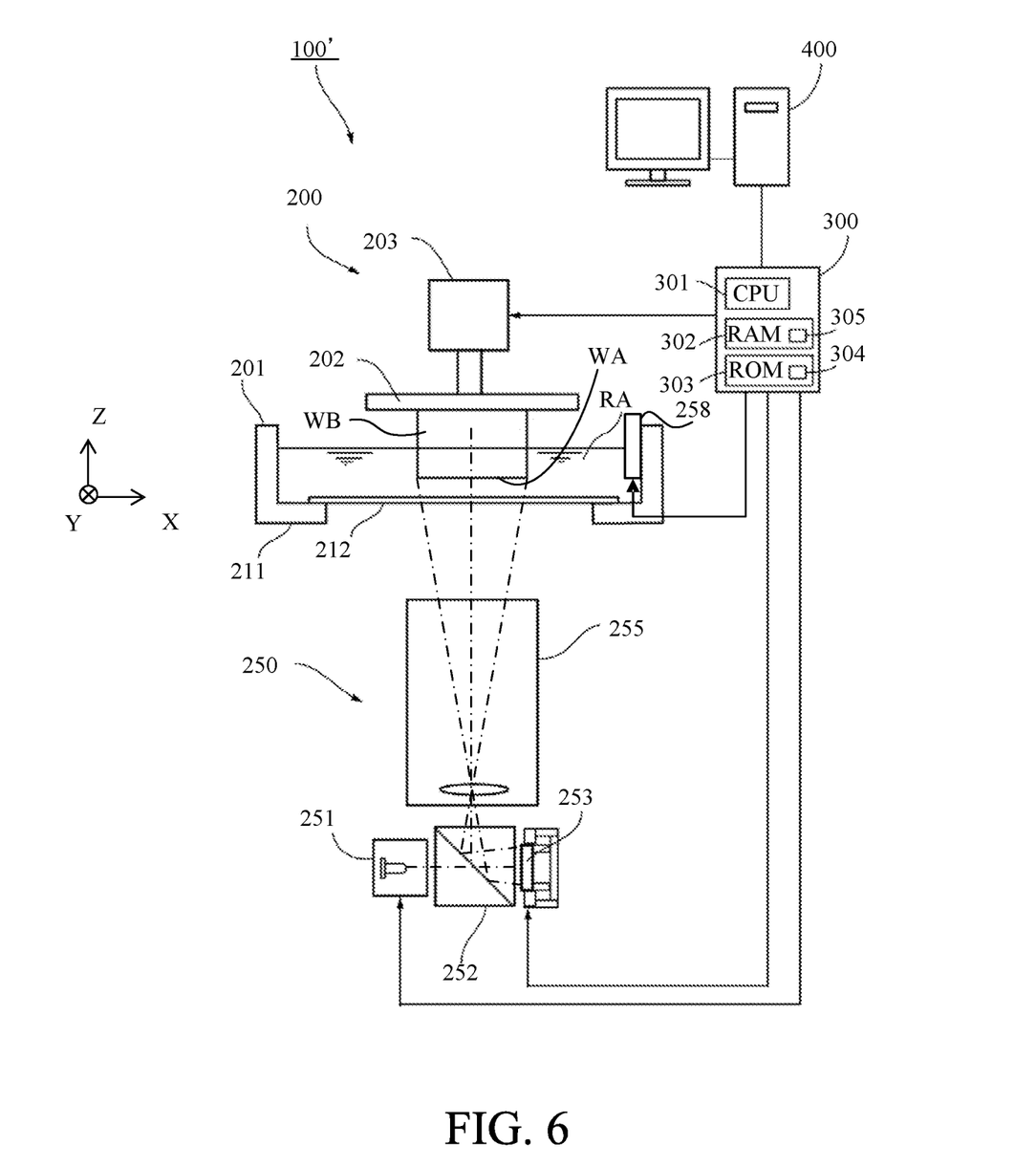
FIG. 6 illustrates a configuration of a three-dimensional shaping apparatus according to a second embodiment of the present invention.

Referring now to FIG. 6, a description will be given of a three-dimensional processing apparatus 100' according to a second embodiment of the present invention. The basic configuration of the three-dimensional processing apparatus 100' according to this embodiment is the same as that of the first embodiment, and common elements will be designated by the same reference numerals as those in the first embodiment and a description thereof will be omitted.

This embodiment provides a temperature sensor 258 configured to detect the temperature in the UV curable resin RA in the container 201. Thereby, the temperature (change) in the UV curable resin RA is detected directly on the real time basis.

This embodiment also sets the irradiation light amount of the image light per unit volume in the UV curable resin RA, as described with reference to FIGS. 5A to 5D in the first embodiment, over time from the shaping start (sequential shaping of the shaped layer WA in the Z direction) according to the temperature change of the UV curable resin RA. This configuration can suppress the defective shaping caused by the change in the light amount necessary for curing caused by the temperature change during shaping.

Third Embodiment

Figure 7:
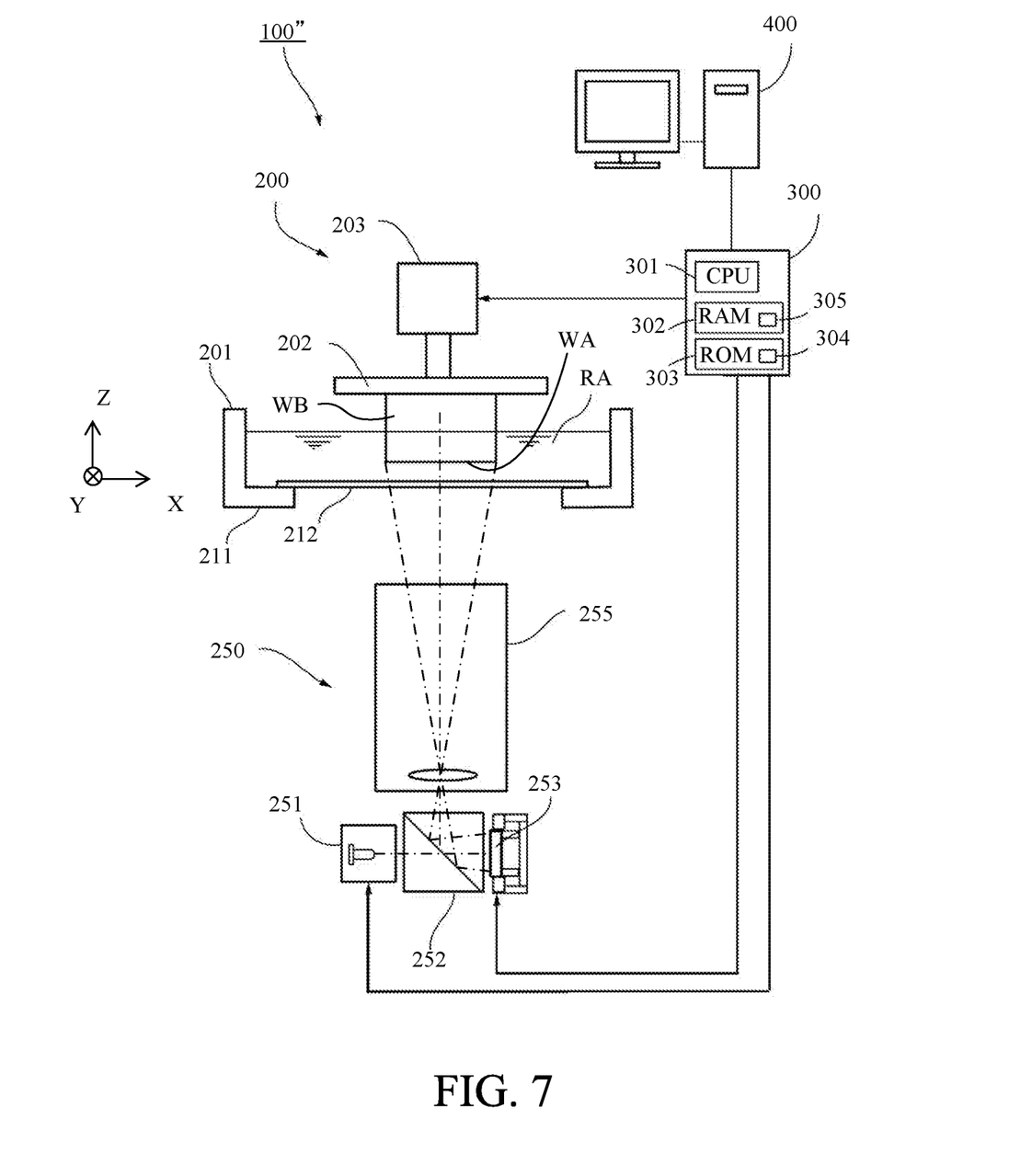
FIG. 7 illustrates a configuration of a three-dimensional shaping apparatus according to a third embodiment of the present invention.

Referring now to FIG. 7, a description will be given of a three-dimensional processing apparatus 100" according to a third embodiment of the present invention. The basic configuration of the three-dimensional processing apparatus 100" according to this embodiment is the same as that of the first embodiment, and common elements will be designated by the same reference numerals as those in the first embodiment and a description thereof will be omitted.

The first and second embodiments detect the temperature distribution and the temperature change in the UV curable resin RA using the thermographic sensor 256 and the temperature sensor 258. On the other hand, this embodiment provides no sensor for detecting the temperature, and predicts a temperature distribution and a temperature change during shaping based on three-dimensional shape data. Then, the light amount necessary for curing corresponding to the prediction result is acquired, and the irradiation light amount is set per unit volume for each of the plurality of resin areas in the X direction (and Y direction) or for each shaping of the resin area in the Z direction for the light amount necessary for curing. Thereby, a simpler apparatus configuration that has no thermographic sensor 256 and no temperature sensor 258 can suppress the defective shaping.

Analyzing the three-dimensional shape data used to shape the shaped object can previously provide irradiation schedule information as information such as the irradiation timing and the number of irradiations of the image light for each resin area in the UV curable resin RA during shaping. The temperature distribution and temperature change in the UV curable resin RA during shaping can be predicted based on the irradiation schedule information for each resin area. In other words, the irradiation schedule information of the image light predicted from the three-dimensional shape data can be used as the information on the temperature distribution and the temperature change.

More specifically, the temperature distribution and the temperature change are predicted from the result of moving average of the irradiation schedule information for each time in each resin area. Then, as described with reference to FIGS. 4A to 4D and 5A to 5D in the first embodiment, the light amount necessary for curing is acquired according to the predicted temperature distribution and temperature change and the irradiation light amount is further controlled.

Figure 8:
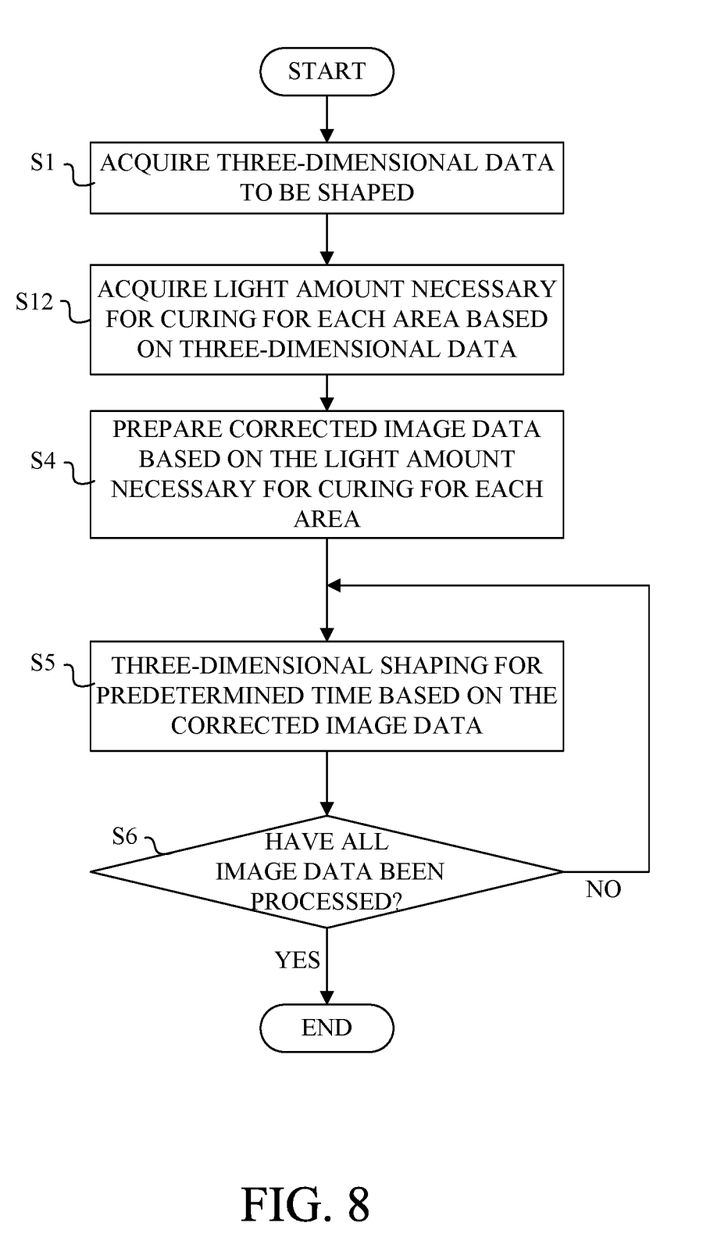
FIG. 8 is a flowchart of a three-dimensional shaping process according to a third embodiment

A flowchart in FIG. 8 illustrates a flow of a three-dimensional shaping process executed by the CPU 301 according to a three-dimensional shaping program of this embodiment. The step S1 and steps S4 to S6 in the flowchart of FIG. 8 are the same as those in the flowchart illustrated in FIG. 3 according to the first embodiment.

In the step S12 in FIG. 8, the CPU 301 analyzes the three-dimensional data (a plurality of original image data) acquired in the step S1 and obtains the irradiation schedule information for each resin area in the UV curable resin RA during shaping as described above. Then, the light amount necessary for curing for each resin area is acquired based on the temperature distribution and the temperature change in the UV curable resin RA during shaping predicted from the irradiation schedule information. Thereafter, the flow proceeds to the step S4.

This embodiment acquires, without actually detecting the temperature, the light amount necessary for curing by predicting the temperature distribution and temperature change during shaping from the irradiation schedule information obtained by analyzing the three-dimensional data. Instead, another method of setting the illumination light amount ratio may be used which does not actually detect the temperature. For example, three-dimensional shape data for distortion calibrations may be prepared which is different from three-dimensional shape data for the shaped object WB, the shaped object for calibrations may be shaped, and the illumination light amount ratio may be set based on the measurement result of the shape of the shaped object for calibrations and stored in the storage unit 305. In this case, the curing rates of a plurality of shaped objects for calibrations may be measured which have been shaped at different temperatures.

The configuration described in this embodiment and the configurations described in the first and second embodiments may be combined with each other. For example, the light amount necessary for curing acquired based on the temperature distribution and the temperature change predicted by the configuration according to this embodiment is corrected based on the temperature distribution and the temperature change actually detected during shaping in the configuration according to the first or second embodiment. This configuration can suppress the defective shaping while the influence of the environmental temperature change during actual shaping different from that when the temperature distribution and the like are predicted.

Fourth Embodiment

The first to third embodiments describe the image light irradiated onto the UV curable resin RA in the container 201 through the light transmitting plate 212 provided at the bottom of the container 201 in the shaping unit 200. However, as in the shaping unit 200' according to a third embodiment of the present invention illustrated in FIG. 9A, the image light from the projection unit 250 may be irradiated onto the UV curable resin RA through the light transmitting plate 212 provided to a ceiling portion of the container 201'. In this case, the shaped layer WA may be sequentially formed by moving the holding plate 202' downwardly by the moving mechanism 203'.

Figure 9A:
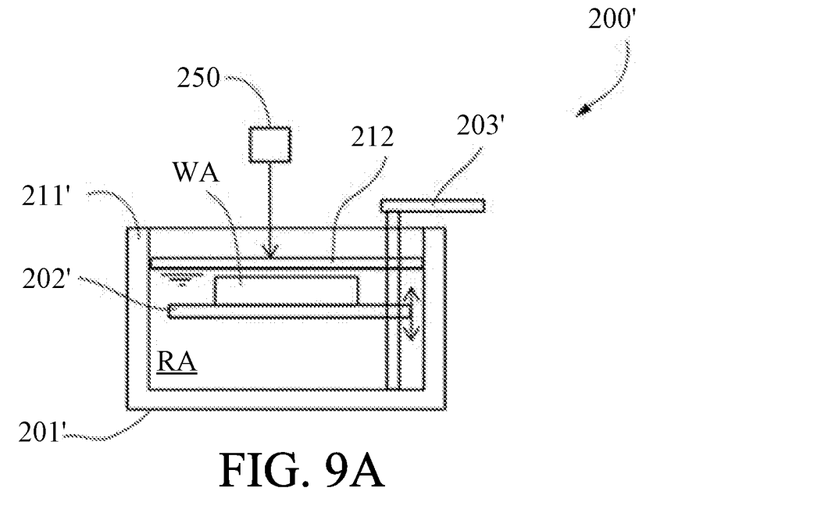
FIGS. 9A and 9B illustrate a shaping unit for a three-dimensional shaping apparatus according to a fourth embodiment of the present invention.
Figure 9B:
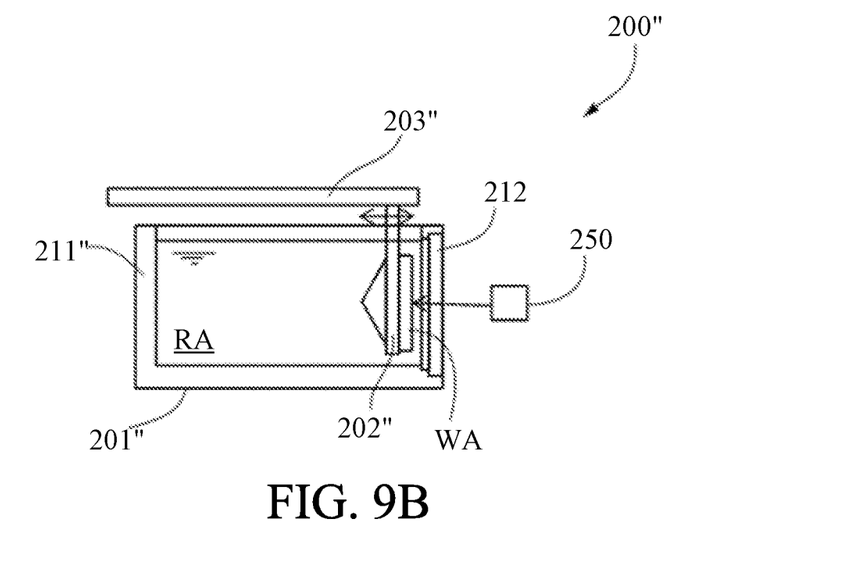

Further, as in the shaping unit 200" illustrated in FIG. 9B, the image light from the projection unit 250 may be irradiated onto the UV curable resin RA through the light transmitting plate 212 provided on a side surface portion of the container 201". In this case, the shaped layer WA may be sequentially formed while the moving mechanism 203" moves the holding plate 202" in the horizontal direction separating from the light transmitting plate 212.

Even in the configurations illustrated in FIGS. 9A and 9B, the temperature distributes and changes due to the heat generated by the environmental temperature fluctuations and photocuring, and may cause the defective shaping. Therefore, the three-dimensional shaping process described in the first to third embodiments can suppress the defective shaping.

Each of the above embodiments has described a dead zone formed by oxygen that has permeates through the light transmitting plate 212. However, a releasing agent (releasing layer) different from the UV curable resin RA may be provided between the UV curable resin RA and the light transmitting plate 212, or the container 201 (201', 201") may be micro vibrated so as to prevent the shaped layer from adhering to the light transmitting plate 212.

Other Embodiments

Embodiment(s) of the present invention can also be realized by a computer of a system or apparatus that reads out and executes computer executable instructions (e.g., one or more programs) recorded on a storage medium (which may also be referred to more fully as a 'non-transitory computer-readable storage medium') to perform the functions of one or more of the above-described embodiment(s) and/or that includes one or more circuits (e.g., application specific integrated circuit (ASIC)) for performing the functions of one or more of the above-described embodiment(s), and by a method performed by the computer of the system or apparatus by, for example, reading out and executing the computer executable instructions from the storage medium to perform the functions of one or more of the above-described embodiment(s) and/or controlling the one or more circuits to perform the functions of one or more of the above-described embodiment(s). The computer may comprise one or more processors (e.g., central processing unit (CPU), micro processing unit (MPU)) and may include a network of separate computers or separate processors to read out and execute the computer executable instructions. The computer executable instructions may be provided to the computer, for example, from a network or the storage medium. The storage medium may include, for example, one or more of a hard disk, a random-access memory (RAM), a read only memory (ROM), a storage of distributed computing systems, an optical disk (such as a compact disc (CD), digital versatile disc (DVD), or Blu-ray Disc (BD)™), a flash memory device, a memory card, and the like.

The present invention can control an irradiation light amount onto a photocurable resin for each resin area and obtain a good shaping accuracy even when the light amount necessary for curing distributes or changes in the photocurable resin during shaping.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

What is claimed is:
1. An optical shaping apparatus comprising:
 a container having a light-transmissive portion and configured to store a liquid photocurable resin;
 a light modulation element having a plurality of pixels and configured to modulate light from a light source for each pixel;

an optical system configured to irradiate modulation light from the light modulation element onto the photocurable resin through the light-transmissive portion;

a controller configured to control the light modulation element based on each of a plurality of two-dimensional shape data obtained from three-dimensional shape data; and a moving member configured to move a cured portion cured by the modulation light among the photocurable resin in a direction separating from the light-transmissive portion, wherein the controller controls the light modulation element so as to irradiate the modulation light of an irradiation light amount corresponding to a light amount necessary for curing for each resin area, onto each of a plurality of resin areas in the photocurable resin based on a temperature distribution or a temperature change in the photocurable resin.

2. The optical shaping apparatus according to claim 1, wherein the controller controls the light modulation element so as to irradiate the modulation light of the irradiation light amount corresponding to the light amount necessary for curing, onto each of the plurality of resin areas for each irradiation of the modulation light based on each of the plurality of two-dimensional shape data.

3. The optical shaping apparatus according to claim 1, wherein where a light amount necessary for curing for a first resin area is smaller than a light amount necessary for curing for a second resin area in the plurality of resin areas, the controller changes the light modulation element so that the irradiation light amount for the first resin area is smaller than the irradiation light amount for the second resin area.

4. The optical shaping apparatus according to claim 1, wherein the controller controls an irradiation duty ratio of the pixel in the light modulation element based on the light amount necessary for curing.

5. The optical shaping apparatus according to claim 1, further comprising a temperature detector configured to detect the temperature distribution or the temperature change in the photocurable resin.

6. The optical shaping apparatus according to claim 1, wherein the controller sets the light amount necessary for curing for each resin area based on the three-dimensional shape data.

7. The optical shaping apparatus according to claim 6, wherein the controller sets the light amount necessary for curing for each resin area based on irradiation schedule information of the modulation light for the plurality of resin areas based on the three-dimensional shape data.

8. The optical shaping apparatus according to claim 1, wherein the controller sets the light amount necessary for curing for each resin area based on information on a shape of the cured portion formed by controlling the light modulation element based on three-dimensional shape data for calibrations.

9. A manufacturing method configured to manufacture a three-dimensional object, the manufacturing method comprising the steps of:

storing a liquid photocurable resin in a container having a light-transmissive portion;

irradiating modulation light from a light modulation element onto the photocurable resin through the light-transmissive portion by controlling the light modulation element based on each of two-dimensional shape data obtained from three-dimensional shape data, the light modulation element having a plurality of pixels and being configured to modulate light from a light source for each pixel;

moving a cured portion cured by the modulation light among the photocurable resin in a direction separating from the light-transmissive portion; and controlling the light modulation element so as to irradiate the modulation light of an irradiation light amount corresponding to a light amount necessary for curing for each resin area, onto each of a plurality of resin areas in the photocurable resin based on a temperature distribution or a temperature change in the photocurable resin.

10. A non-transitory computer-readable storage medium storing an optically shaping program that enables a computer in an optical shaping apparatus to execute an optically shaping process, the optical shaping apparatus including a container having a light-transmissive portion and configured to store a liquid photocurable resin, a light modulation element having a plurality of pixels and configured to modulate light from a light source for each pixel, and an optical system configured to irradiate modulation light from the light modulation element onto the photocurable resin through the light-transmissive portion, the optically shaping process comprising the steps of:

controlling the light modulation element based on each of a plurality of two-dimensional shape data obtained from three-dimensional shape data;

moving a cured portion cured by the modulation light among the photocurable resin in a direction separating from the light-transmissive portion; and controlling the light modulation element so as to irradiate the modulation light of an irradiation light amount corresponding to a light amount necessary for curing for each resin area, onto each of a plurality of resin areas in the photocurable resin based on a temperature distribution or a temperature change in the photocurable resin.

* * * * *